US012598805B2

(12) United States Patent　　　　(10) Patent No.:　US 12,598,805 B2
Edwards et al.　　　　　　　　　　(45) Date of Patent:　　　Apr. 7, 2026

(54) VERTICAL FIN-BASED FIELD EFFECT TRANSISTOR (FINFET) WITH CONNECTED FIN TIPS

(71) Applicant: SEMICONDUCTOR COMPONENTS INDUSTRIES, LLC, Scottsdale, AZ (US)

(72) Inventors: Andrew P. Edwards, Santa Clara, CA (US); Andrew J. Walker, Santa Clara, CA (US); Clifford Drowley, Santa Clara, CA (US); Subhash Srinivas Pidaparthi, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 454 days.

(21) Appl. No.: 18/137,093

(22) Filed: Apr. 20, 2023

(65) Prior Publication Data

US 2023/0361126 A1　　Nov. 9, 2023

Related U.S. Application Data

(60) Provisional application No. 63/333,057, filed on Apr. 20, 2022.

(51) Int. Cl.
　　*H10D 84/86*　　　(2025.01)
　　*H10D 30/47*　　　(2025.01)
　　*H10D 62/85*　　　(2025.01)
(52) U.S. Cl.
　　CPC ........... *H10D 84/86* (2025.01); *H10D 30/477* (2025.01); *H10D 62/8503* (2025.01)

(58) Field of Classification Search
　　CPC .. H10D 30/015; H10D 30/024; H10D 30/025; H10D 30/477; H10D 30/475; H10D 30/4755; H10D 30/478; H10D 30/485; H10D 30/62; H10D 30/6215; H10D 30/63; H10D 30/831; H10D 30/801; H10D 62/126; H10D 62/127; H10D 62/328; H10D 62/343; H10D 62/824; H10D 62/117; H10D 62/405; H10D 62/85; H10D 62/8503; H10D 64/23; H10D 64/251; H10D 64/252; H10D 64/2565; H10D 64/512–519; H10D 64/62; H10D 64/647; H10D 64/669;
　　(Continued)

(56)　　　　　References Cited

U.S. PATENT DOCUMENTS 11,164,950 B2 * 11/2021 Nishii .................. H10D 30/668
2007/0096145 A1 * 5/2007 Watanabe ............ H10D 30/831
　　　　　　　　　　　　　　　　　　257/E29.313

(Continued)

*Primary Examiner* — Natalia A Gondarenko
(74) *Attorney, Agent, or Firm* — Kevin B. Jackson

(57)　　　　　ABSTRACT

A vertical fin-based field effect transistor (FinFET) device includes an array of FinFETs comprising a plurality of rows and columns of fins, each of the fins having a fin length and a fin width measured laterally with respect to the fin length and including a first fin tip disposed at a first end of the fin; a second fin tip disposed at a second end of the fin opposing the first end; a bridging structure connecting the first fin tip to an adjacent fin; a central region disposed between the first fin tip and the second fin tip and characterized by an electrical conductivity; and a source contact electrically coupled to the central region. The FinFET device also includes a gate region surrounding the fins.

20 Claims, 9 Drawing Sheets

(58) Field of Classification Search
CPC ............. H10D 84/016; H10D 84/0186; H10D 84/0193; H10D 84/038; H10D 84/05; H10D 84/834; H10D 84/86; H10D 86/011; H10D 86/215; H10D 86/411; H01L 23/481; H01L 23/535; H10W 20/20; H10W 20/211; H10W 20/212; H10W 20/2125; H10W 20/2128; H10W 20/213; H10W 20/2134; H10W 20/215; H10W 20/216; H10W 20/217; H10W 20/218; H10W 20/222; H10W 20/233
USPC .................... 257/76, 77, 134, 192, 194, 330
See application file for complete search history.

(56) References Cited

U.S. PATENT DOCUMENTS

| | | | |
|---|---|---|---|
| 2016/0155809 A1 * | 6/2016 | Tegen .................. | H10D 62/127 |
| | | | 257/334 |
| 2021/0028312 A1 * | 1/2021 | Drowley .............. | H10D 64/602 |
| 2022/0013626 A1 | 1/2022 | Pidaparthi et al. | |
| 2022/0328476 A1 | 10/2022 | Drowley et al. | |

* cited by examiner

1

VERTICAL FIN-BASED FIELD EFFECT TRANSISTOR (FINFET) WITH CONNECTED FIN TIPS

CROSS-REFERENCES TO RELATED APPLICATIONS

This application claims priority to U.S. Provisional Patent Application No. 63/333,057, filed Apr. 20, 2022, and entitled "Fin-Based Vertical Field Effect Transistor (FinFET) with Connected Fin Tips," the entire contents of which are hereby incorporated by reference in their entirety.

BACKGROUND OF THE INVENTION

Vertical power transistors, in which the current flows from the top surface of the transistor to the back or bottom surface of the transistor substrate, are commonly used for controlling high currents and high voltages, since they can be formed with a reduced area compared to devices in which current flow through the transistor is lateral (e.g., a gallium nitride high electron mobility transistor (HEMT).

III-nitride materials, and in particular, gallium nitride (GaN) substrates, allow vertical FET-based power transistors to be fabricated with high breakdown voltages (e.g., in excess of 1200 V) while offering significant reductions in the specific on-resistance (i.e., the on-resistance of the device multiplied by the device area) compared to silicon or silicon carbide materials.

Despite the progress made in the field of vertical power transistors, there is a need in the art for improved methods and systems related to vertical power transistors.

SUMMARY OF THE INVENTION

The present invention generally relates to the field of electronics, and more specifically to semiconductor manufacturing technology. In a particular embodiment, structures and methods of forming a fin-based field effect transistor (FinFET) with leakage improvement are provided. Embodiments of the present invention are applicable to a variety of different, vertical FET structures and gate configurations.

According to an embodiment of the present invention, a vertical fin-based field effect transistor (FinFET) device is provided. The vertical FinFET device includes an array of FinFETs comprising a plurality of rows and columns of fins, each of the fins having a fin length and a fin width measured laterally with respect to the fin length and including: a first fin tip disposed at a first end of each of the fins; a second fin tip disposed at a second end of each of the fins, wherein the second end opposes the first end; a bridging structure connecting the first fin tip to an adjacent fin; a central region disposed between the first fin tip and the second fin tip and characterized by an electrical conductivity; and a source contact electrically coupled to the central region. The vertical FinFET device also includes a gate region surrounding each of the fins.

The bridging structure can include a first segment extending from the first fin tip and a second segment extending from the first segment to the adjacent fin. The second segment can be oriented towards the first segment. The fin length, the first segment of the bridging structure, and the second segment of the bridging structure can each align with an m-plane of a GaN crystal. Each of the fins can include a III-N semiconductor, such as GaN. The bridging structure can be a first bridging structure and the vertical FinFET device can further include a second bridging structure connecting the second fin tip to the adjacent fin. The second bridging structure can include a third segment disposed at the second fin tip and a fourth segment disposed between the third segment and the adjacent fin, the fourth segment oriented towards the third segment. The first bridging structure and the second bridging structure can be shared by adjacent rows of the plurality of rows. Adjacent rows of the plurality of rows can be separated by a second gate region. The bridging structure can be characterized by a second electrical conductivity less than the electrical conductivity of the central region. The bridging structure can include implanted ions.

According to another embodiment of the present invention, a vertical fin-based field effect transistor (FinFET) device is provided. The vertical FinFET device includes an array of FinFETs comprising a plurality of rows and columns of fins. Each of the fins has a fin length and a fin width measured laterally with respect to the fin length and includes a first fin tip disposed at a first end of each of the fins, a second fin tip disposed at a second end of each of the fins, wherein the second end opposes the first end, a central region disposed between the first fin tip and the second fin tip and characterized by an electrical conductivity, a bridging structure connecting the first fin tip to an adjacent fin, the bridging structure characterized by a second electrical conductivity less than the electrical conductivity of the central region, and a source contact electrically coupled to the central region. The vertical FinFET device also includes a gate region surrounding each of the fins.

The bridging structure can include implanted ions. The bridging structure can include a first segment disposed at the first fin tip and a second segment disposed between the first segment and the adjacent fin, the second segment oriented towards the first segment. The fin length, the first segment of the bridging structure, and the second segment of the bridging structure can each align with an m-plane of GaN. Each of the fins can include a III-N semiconductor, for example, GaN. The bridging structure can be a first bridging structure and the vertical FinFET device can further include a second bridging structure connecting the second fin tip to the adjacent fin. The second bridging structure can include a third segment disposed at the second fin tip and a fourth segment disposed between the third segment and the adjacent fin, the fourth segment oriented towards the third segment. The first bridging structure and the second bridging structure can be shared by adjacent rows of the plurality of rows. Adjacent rows of the plurality of rows can be separated by a second gate region.

Numerous benefits are achieved by way of the present disclosure over conventional techniques. For example, embodiments of the present disclosure provide methods and systems that reduce leakage in arrays of vertical transistors. These and other embodiments of the disclosure, along with many of its advantages and features, are described in more detail in conjunction with the text below and corresponding figures.

DETAILED DESCRIPTION OF SPECIFIC EMBODIMENTS

Figure 1:
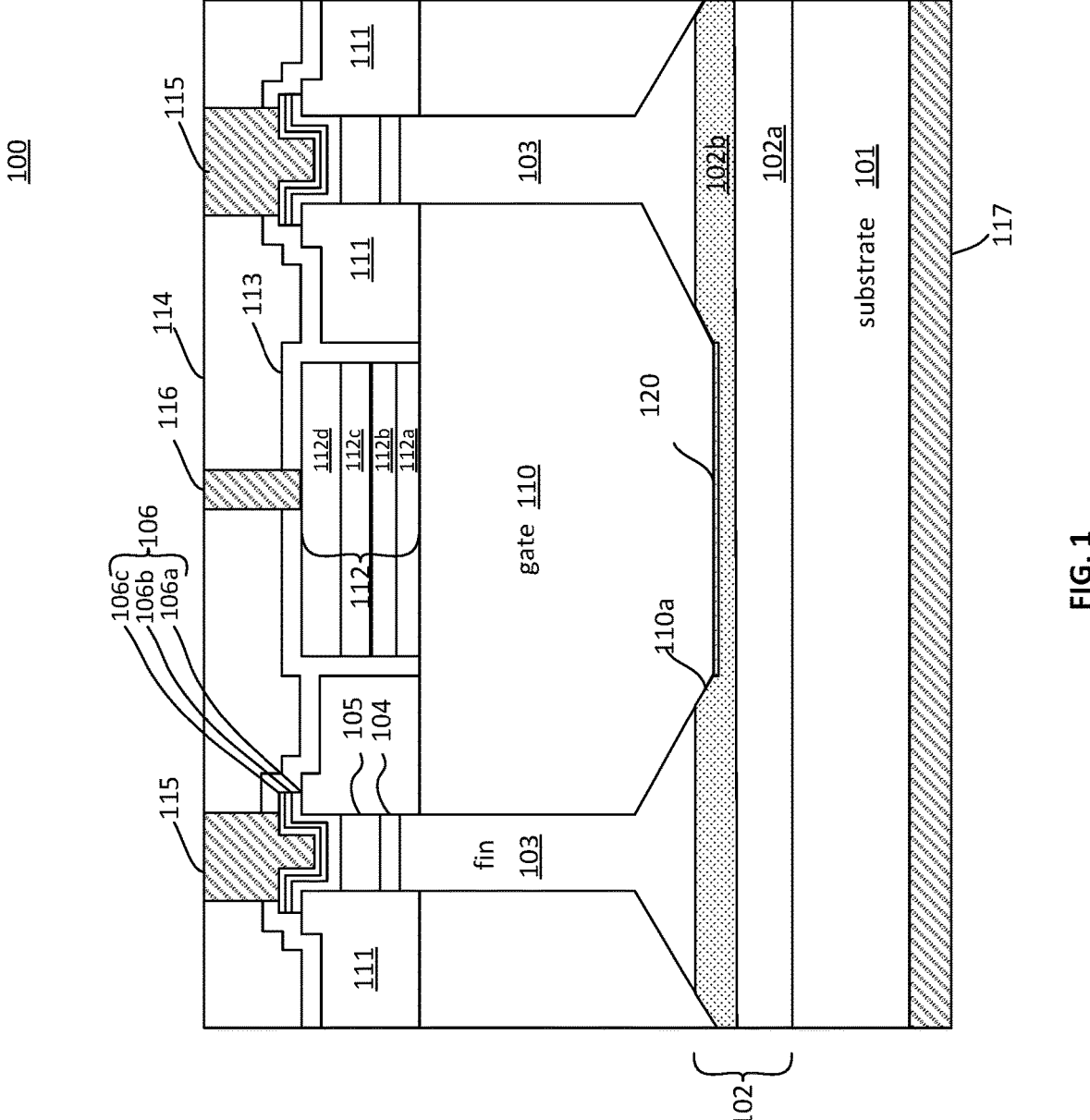
FIG. 1 is a cross-sectional view of a vertical fin-based field effect transistor device according to an embodiment of the present disclosure.

The present invention generally relates to the field of electronics, and more specifically to semiconductor manufacturing technology. In a particular embodiment, structures and methods of forming a fin-based field effect transistor (FinFET) with leakage improvement are provided. Embodiments of the present invention are applicable to a variety of different, vertical field effect transistor (FET) structures and gate configurations. As an example, the methods and systems discussed herein are applicable to trench MOSFETs and implanted/diffused fin-JFETs.

Power transistors that can withstand high voltages (>600 V) are becoming popular in applications such as industrial and commercial power supplies, solar inverters, and electric vehicle (EV) power trains. A key performance specification for such a transistor is to exhibit low leakage. High leakage causes higher power dissipation in the off-state and during switching. High leakage can also cause inefficient power conversion and device failure. As described herein, embodiments of the present invention reduce leakage for high power transistors.

In addition, in order to reduce the resistance of the switch and reduce parasitic capacitances, etc., that limit switch speed, an increased conductance per unit area is desirable. Switch transistors in which the current flow is primarily vertical offer reduced resistance per area; this benefit can be further improved by arranging the control channel of the transistor to lie in the vertical direction, e.g., a "trench" channel transistor. The resistance of the transistor has several components, including the resistance of the transistor channel (i.e., the region where current is directly controlled by the input gate voltage), the resistance of the "drift" region (i.e., the region designed to hold the breakdown voltage of the transistor), and resistance of the starting substrate, contacts, metals, etc.

Transistors with a vertical current flow are typically designed with the drain contact at the bottom surface of the device and the gate and source contacts at the top surface of the device.

In order to maximize the switch conductivity (i.e., minimize the switch resistance) and provide a uniform transient response for the device, the transistor may be fabricated using an array of many small, vertical-channel switch devices surrounded by control gates (e.g., an array of "gate-all-around" transistors). The finished device has all sources connected to a single electrode, a common gate electrode, and a single drain electrode.

Improvements in switch resistance and capacitance can be made by changing the semiconductor material from silicon to a wide bandgap material such as gallium nitride (GaN), which offers a higher critical field for breakdown. This allows the high-voltage drift region of the device to be made thinner and more heavily doped than with similar silicon devices, reducing the "specific resistance" (i.e., resistance× area) of the drift region, and reducing the device on-resistance for a given die size.

For a vertical FET transistor structure, a transistor conducting channel can be formed using a semiconductor "fin" created by patterning and etching surrounding material to a certain depth. A semiconductor material with an opposite doping type can be epitaxially regrown (e.g., using metalorganic chemical vapor deposition (MOCVD)) to be substantially planar with the top of the semiconductor "fin." The regrown material can serve as the gate electrode of a vertical FET, and application of control voltages to the gate electrode modulates the conduction of current in the vertical "fin" channel between the top of the fin ("source") and bottom of the fin (normally, the drift region that is further connected to the "drain" electrode via the semiconductor substrate).

The regrown gate material can surround the fin. An array of fins can be fabricated with a common gate using this approach, with, for example, fins arranged in a number of rows and columns so that the total number of transistors achieves the desired on-resistance target for the final device.

As mentioned above, the array of FinFETs includes a number of rows and columns of fins. Each of the fins has a length and a width measured laterally (i.e., in the plane perpendicular to the fin height as illustrated by the x-y plane in FIG. 3B) with respect to the length. A first fin tip is disposed at a first end of the fin, whereas a second fin tip is disposed at a second end of the fin opposing the first end. The first fin tip and the second fin tip are also referred to as the fin tips of the fin. A central region of the fin is disposed between the first fin tip and the second fin tip.

In vertically regrown FinFETs, the fin tips can present a source of non-uniformity. The fins, by necessity, must present a different sidewall face or set of faces at the tip than in the main part of the fin. Typically, the fin tips are defined by the combination of multiple planes. For best regrowth quality, the fin patterns should be crystallographically aligned to the m-plane. But at the fin tips, the regrowth quality may be impacted due to growth on planes other than the m-plane. This variation in regrowth characteristics may cause a higher junction leakage between the gate and the source than desired.

Second, since fin tips are defined by a combination of multiple planes, a crystallographic etch, such as tetramethylammonium hydroxide (TMAH), can cause varying etch rates at fin tips. This can cause non-uniform epitaxial overgrowth at fin tips and could lead to higher gate-source junction leakage.

Embodiments of the present disclosure provide FinFETs with the fin tips of adjacent fins connected via a bridging structure. The bridging structure may comprise a fin of the same or similar width as the main portion of the fin. Connecting adjacent fins effectively reduces a number of fin tips in the FinFET array. In addition, the bridging structure can be crystallographically aligned to the m-plane, which can improve the uniformity of the fins and reduce gate-source junction leakage.

FIG. 1 is a cross-sectional view of a vertical fin-based field effect transistor device according to an embodiment of the present disclosure. The terms "FET," "FinFET," and "vertical fin-based FET" are interchangeable used herein. Referring to FIG. 1, FET device 100 may include a semiconductor substrate 101, a drift layer 102 (e.g., an n-type GaN drift layer) including a uniformly doped region 102a on semiconductor substrate 101 and a graded doping region 102b on uniformly doped region 102a, and a plurality of fins 103 protruding from graded doping region 102b. In one embodiment, each of the fins 103 may include a heavily doped layer 104 disposed in an upper portion of the fin and a metal layer 105, e.g., a refractory metal, refractory metal compound or refractory metal alloy layer (e.g., a TiN layer) disposed on heavily doped layer 104. FET device 100 may also include a source contact structure 106 on metal layer 105 (e.g., TiN). Source contact structure 106 may include a titanium (Ti) layer 106a on metal layer 105, an aluminum (Al) layer 106b on titanium (Ti) layer 106a, and a barrier metal layer (e.g., molybdenum (Mo), titanium (Ti), tantalum (Ta), or similar) 106c on aluminum (Al) layer 106b.

FET device 100 may further include a gate region 110 having a bottom portion in direct contact with graded doping region 102b, an insulating layer 111 (e.g., including silicon dioxide or silicon nitride) disposed on gate region 110 and surrounding fins 103, a gate contact structure 112 disposed on gate region 110, a first interlayer dielectric layer 113 disposed on insulating layer 111 and gate contact structure 112, and a second interlayer dielectric layer 114 disposed on first interlayer dielectric layer 113. In one embodiment, gate contact structure 112 may include a nickel (Ni) layer 112a disposed on gate region 110, a first gold (Au) layer 112b disposed on nickel (Ni) layer 112a, a barrier layer 112c, including, for example, a metal layer (e.g., molybdenum (Mo), titanium (Ti), tantalum (Ta), or the like) disposed on first gold (Au) layer 112b, and a second gold (Au) layer 112d disposed on barrier layer 112c.

FET device 100 may also include a first via contact 115 extending through first interlayer dielectric layer 113 and second interlayer dielectric layer 114 and in contact with source contact structure 106, a second via contact 116 extending through first interlayer dielectric layer 113 and second interlayer dielectric layer 114 and in contact with gate contact structure 112, and a drain metal layer 117 forming a drain contact on the bottom surface of semiconductor substrate 101. As used herein, the terms "drift layer" and "drift region" are used interchangeably, the terms "doped layer" and "doped region" are used interchangeably, and the terms "graded doping region" and "graded doping layer" are used interchangeably.

In some embodiments, semiconductor substrate 101 may include an n-type (e.g., N+ dopant) III-nitride material, fins 103 may include an n-type (e.g., N dopant) III-nitride material having a first dopant concentration, and uniformly doped region 102a of drift layer 102 may include an n-type (e.g., N doped) III-nitride material having a second dopant concentration lower than the first dopant concentration, and graded doping region 102b having a third dopant concentration that increases (e.g., linearly) from the second dopant concentration to the first dopant concentration.

In one embodiment, the first dopant concentration is about $7.5 \times 10^{16}$ atoms/cm$^3$, and the second dopant concentration is about $1 \times 10^{16}$ atoms/cm$^3$.

In one embodiment, the drift region has a thickness of about 12 μm, the graded doping region has a thickness of about 0.3 μm, and the semiconductor fin has a height in a range between about 0.7 μm and 0.8 μm and a width of about 0.2 μm.

In one embodiment, gate region 110 may include an In$_x$Ga$_{1-x}$N layer, where 0<x<1, i.e., x is between 0 and 1 and is not equal to 0 or 1. In one embodiment, gate region 110 is disposed in a recess region between two adjacent fins and has a portion 110a in contact with graded doping region 102b. The depth (or the thickness) of portion 110a of the gate layer may affect the threshold voltage, the conductance, and the maximum electric field of the FET device. The effect of the depth (or thickness) of portion 110a embedded in the graded doping region will be described in more detail below.

In one embodiment, the FET device 100 may include a semiconductor substrate 101, which may include an n-type (e.g., N+ doped) GaN material layer, a drain metal layer 117 disposed at its bottom surface, a drift layer 102, e.g., an n-type (e.g., N doped) GaN drift layer, having a uniformly doped region 102a disposed on semiconductor substrate 101 and a graded doping region 102b disposed on the uniformly doped region, and an epitaxial GaN layer disposed on the graded doping region and including a recess region for forming a plurality of fins 103. The FET device may also include a p-type GaN gate layer filling the recess region. The graded doping region 102b may function as a landing pad to ensure sufficient contact for gate region 110. In one embodiment, the gate layer may include a ternary compound semiconductor layer (e.g., an In$_x$Ga$_{1-x}$N layer, where 0<x<1). In one embodiment, portion 110a of the gate region 110 may have a depth (or thickness) of about 0.1 μm (+/−0.1 um) extending into graded doping region 102b. The fins each may have a width of about 0.2 μm and are spaced from each other by a space of about 2.0 μm, i.e., the recess region or the gate layer filling the recess region between two adjacent fins has a lateral width of about 2.0 μm. The FET device may also include a two-dimensional electron gas (2DEG) layer 120 formed in an interface between gate region 110 and graded doping region 102b. The area surface of gate region 110 is large, so that a current flows laterally along 2DEG layer 120 before flowing vertically toward drain metal layer 117 in the direction of the substrate, thereby improving the conductance (reducing the on-resistance) of the FET device. In other words, the channel FET device has two portions, with a first portion being a lateral channel that controls the current flow through the 2DEG layer, which distributes the current efficiently in the drift region, and a second portion being a vertical channel which carries the current vertically through the drift region toward semiconductor substrate 101 and drain metal layer 117.

In one embodiment, each of the fins may include a metal layer 105 made of TiN and a multilayer source metal structure (e.g., stacked layers of Ti/Al or Ti/TiN/Al) in which Ti is in contact with metal layer 105. The FET device may also include an insulating layer 111, e.g., a silicon dioxide or silicon nitride layer on gate region 110, which may also be referred to as a dielectric layer. Insulating layer 111 includes an opening where a gate contact structure 112 (e.g., a gate electrode) is formed in contact with gate region 110. Gate contact structure 112 can have a multilayer structure of metals, e.g., Pd/Pt/Au, where Pd is in contact with gate region 110, or Ni and Au, in which the Ni is deposited in contact with gate region 110. Other embodiments can include other gate electrode metal structures known to those skilled in the art.

In one embodiment, each of the fins may include an upper portion having sidewalls parallel to each other and substantially perpendicular to the surface of the substrate and a lower portion having sidewalls non-parallel to each other and forming an angle other than 90 degrees with the surface of the substrate. The parallel sidewalls may define a non-polar plane, such as an m-plane.

In one embodiment, the 2DEG layer is induced by a polarization between the gate layer and the drift region in a c-plane, and the current flowing vertically through the drift region is along an m-plane.

Figure 2:
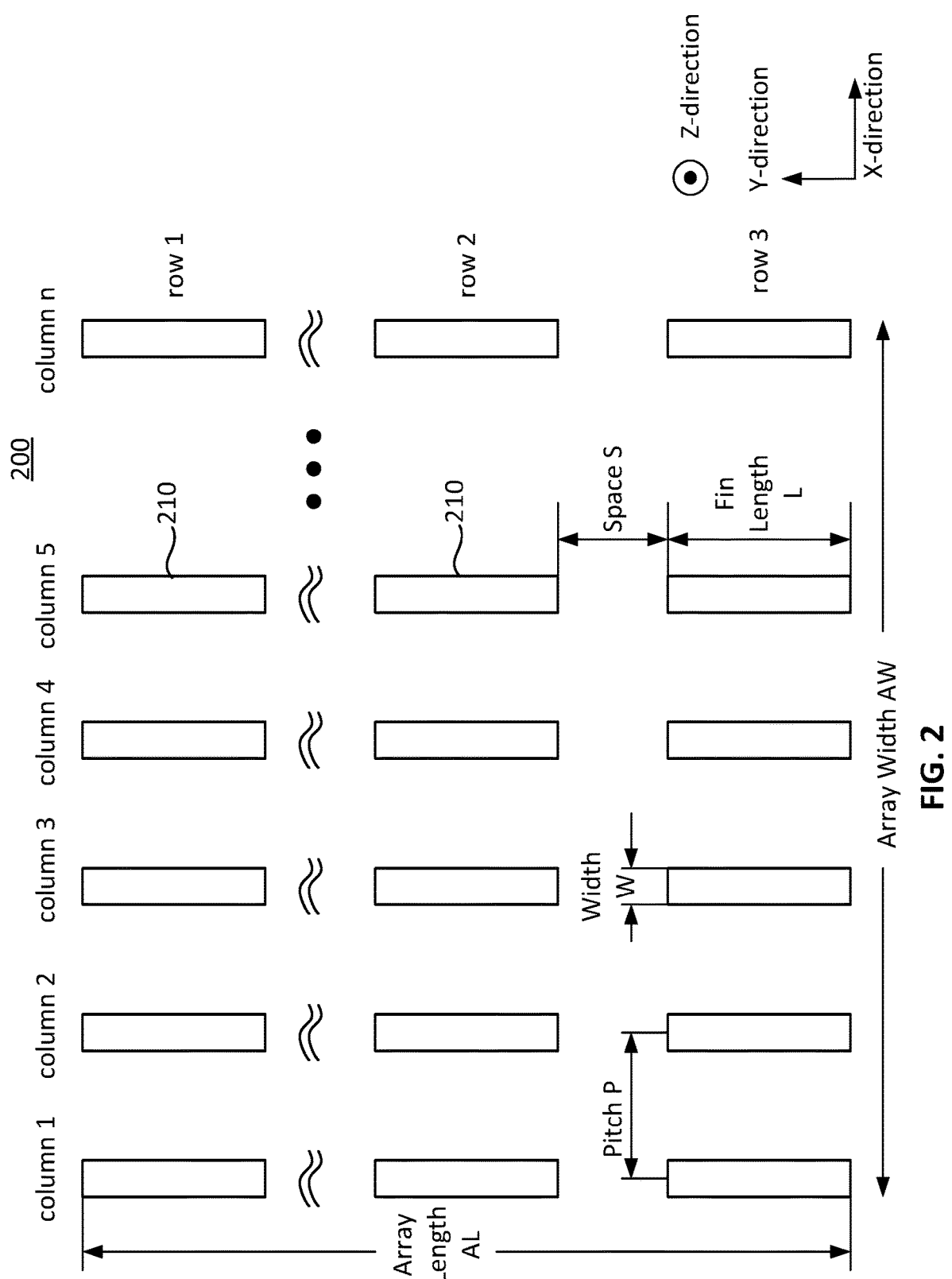
FIG. 2 is a plan view of a fin pattern layout illustrating semiconductor fins having predetermined lengths according to an embodiment of the present disclosure.

FIG. 2 is a plan view of a fin pattern layout illustrating a fin array 200 having a plurality of semiconductor fins having predetermined lengths according to an embodiment of the present disclosure. A fin is illustrated as a bar-shaped fin having a length smaller than 100 μm, e.g., 50 μm, 25 μm. Referring to FIG. 2, fin array 200 includes a plurality of fins 210 arranged in a plurality of rows (row 1, row 2, row 3) and in a plurality of columns (column 1, column, 2, . . . , column n). The fins in each row are separated from each other by a pitch P. Each row is separated from each other by a space S (i.e., the gap between each row). The total length of the array is thus related to the individual fin length L, the number of rows N, and the space S by AL=N*L+(N−1)*S. In one embodiment, the space S has a size equal to the pitch P. In another embodiment, the space S can have a size greater than a single pitch P (e.g., 1.2×P, 1.5×P, or 2×P). It is understood that the number of rows and the number of columns can be any integer number. In one embodiment, the number of columns in different rows may be different, for example, to enable "rounding" of the array for improved junction-terminated edge designs. In the example shown in FIG. 2, six fins are used in each row, three rows and six columns are shown, but it is understood that the number of fins and the number of rows and columns are arbitrarily chosen for describing the example embodiment and should not be limiting.

In one exemplary embodiment, the fin length L is about 25 μm, the fin width W is about 0.2 μm, the fin thickness or fin height measured along the z-direction is about 0.8 μm, the pitch P is in the range between 1.5 μm and 2.5 μm. In one embodiment, a ratio between a fin width W and a pitch P between two adjacent fins is in the range between about 0.08 and 0.13, preferably in the range between 0.1 and 0.12. In one embodiment, a ratio between a fin length L and the pitch P between two adjacent fins is in the range between 5 and 25, preferably between 10 and 20, and more preferably between 12 and 16. In one embodiment, the fin length L is about 25 μm and the fin width W is in the range between 0.15 μm and 0.7 μm.

Figures 3A, 3B:
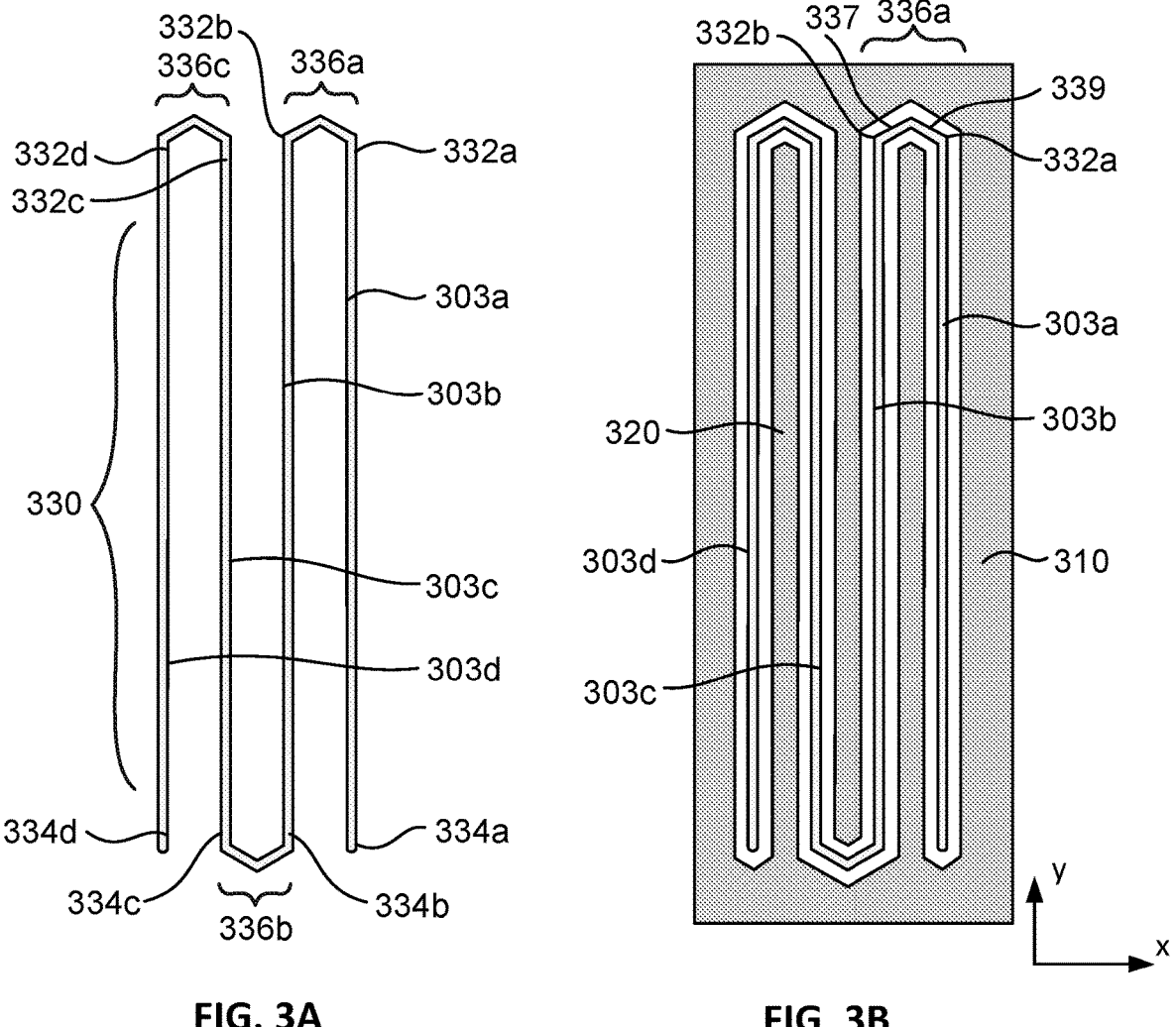
FIGS. 3A-3B are plan views illustrating fins connected via a bridging structure according to an embodiment of the present invention.

FIGS. 3A-3B are plan views illustrating fins 303a-d connected via bridging structures 336a-c according to an embodiment of the present invention. For purposes of clarity, FIG. 3A does not show a gate metal disposed around the fins. FIG. 3B illustrates the gate region 310. In the example shown in FIG. 3A, each of the fins 303a-d has a first fin tip 332a-d disposed at a first end and a second fin tip 334a-d disposed at a second end opposing the first end. A central region 330 is disposed between the first fin tip 332 and the second fin tip 334. The bridging structure 336a-c connects each of the fins 303a-d to an adjacent fin of the fins 303a-d. For example, the fin 303a is adjacent the fin 303b, which is adjacent to the fin 303c, which is adjacent to the fin 303d. As illustrated in FIG. 3A, the first fin tip 332a of the fin 303a is connected to the first fin tip 332b of the fin 303b via the bridging structure 336a. In addition, the second fin tip 334b of the fin 303b is connected to the second fin tip 334c of the fin 303c via the bridging structure 336b, and the first fin tip 332c of the fin 303c is connected to the first fin tip 332d of the fin 303d via the bridging structure 336c. As illustrated in FIG. 3A, fin 303a, bridging structure 336a, and fin 303b form four sides of a hexagonal structure. As described more fully below, the segments of the bridging structure and the fins are aligned with the m-planes of a GaN crystal.

The bridging structures 336a-d can effectively reduce a number of fin tip ends in a fin array of a FinFET device. For instance, rather than the fin array of FIG. 3A having eight fin tip ends, the fin array only has two fin tip ends (i.e., second fin tips 334a and 334d). The fin tip ends may exist only at ends of rows of the fin array, so rows with more fins than as shown in FIG. 3A can still only have two fin tip ends. As a result, the fin array with fins connected with bridging structures can have reduced leakage.

Referring to FIG. 3B, the bridging structure 336a can include a first segment 339 disposed at the first fin tip 332a and a second segment 337 disposed between the first segment 339 and the fin 303b that is adjacent to the first segment 339. The first segment 339 and the second segment 337 can be oriented towards each other so that the first segment 339 and the second segment 337 meet at a point between the fin 303a and the fin 303b. The first segment 339 and the second segment 337 can have the same width as the fins 303. Additionally, each of the first segment 339 and the second segment 337 can have a length longer than the fin width of each of the fins 303. The first segment 339 and the second segment 337 can be angled to align with an m-plane of a GaN crystal. As a result, the fin length of the fins 303, the first segment 339 of the bridging structure 336, and the second segment 337 of the bridging structure 336 can each align with the m-plane. Alignment of the first segment 339 and the second segment 337 with the m-plane can reduce non-uniformity of the first fin tip 332a and the first fin tip 332b of the fin 303a and the fin 303b, respectively, thereby reducing leakage.

FIG. 3B includes the gate region 310 surrounding the fins 303. With the fins 303 connected via the bridging structure 336 at one end, the gate region 310 can extend along the length of the fins 303. Referring to FIG. 3B, gate lead 320 extends along the y-direction between fin 303d and fin 303c in order to provide gate bias to gate contacts of the FinFETs associated with fin 303d and fin 303c. Other gate leads are illustrated between the adjacent fins. The gate region 310 can be routed as an interdigitated structure as illustrated in FIG. 3B or connected to an additional gate bus metal layer.

Figure 4:
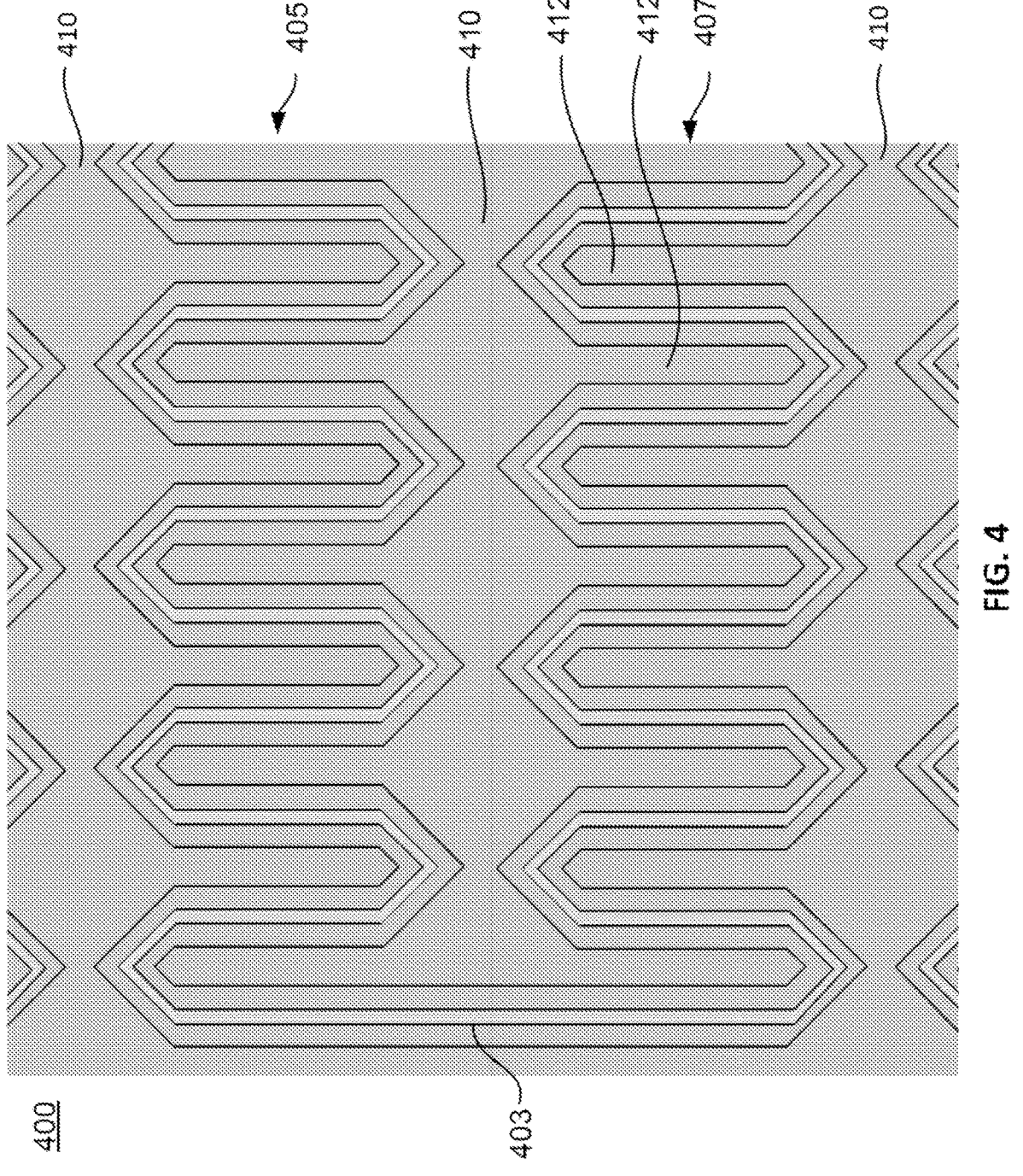
FIG. 4 is a plan view schematic diagram illustrating a layout of a fin array connected via bridging structures according to an embodiment of the present invention.

FIG. 4 is a plan view schematic diagram illustrating a layout of a fin array 400 connected via bridging structures according to an embodiment of the present invention. The fin array 400 is similar to the fin configuration described in FIG. 3B. The fin array 400 includes multiple rows and columns of fins, and each fin is connected to adjacent fin(s) via a bridging structure. In addition, fin 403 is illustrated as extending from a first row 405 of fins to a second row 407 of fins, thereby reducing a number of fin tip ends in the fin array 400. In other examples, the fin tip ends may be disposed outside of an active area of the FinFET device, for example, as a fin tip of an inactive fin. Additional description related to inactive fins utilized in conjunction with an active array is provided in U.S. patent application Ser. No. 17/707, 839, filed on Mar. 29, 2022, the disclosure of which is hereby incorporated by reference in its entirety for all purposes.

In order to provide gate bias, a gate routing line 410 is disposed between adjacent rows of the fin array 400. Gate routing line 410 can be connected to a gate bus at the periphery of the semiconductor die including fin array 400. Gate leads 412 are connected to gate routing line 410 and extend between adjacent fins toward the bridging structures connecting adjacent fins. Thus, in this implementation, inter-digitated gate leads are utilized to provide the gate bias to the gates of the FinFETs.

Figure 5:
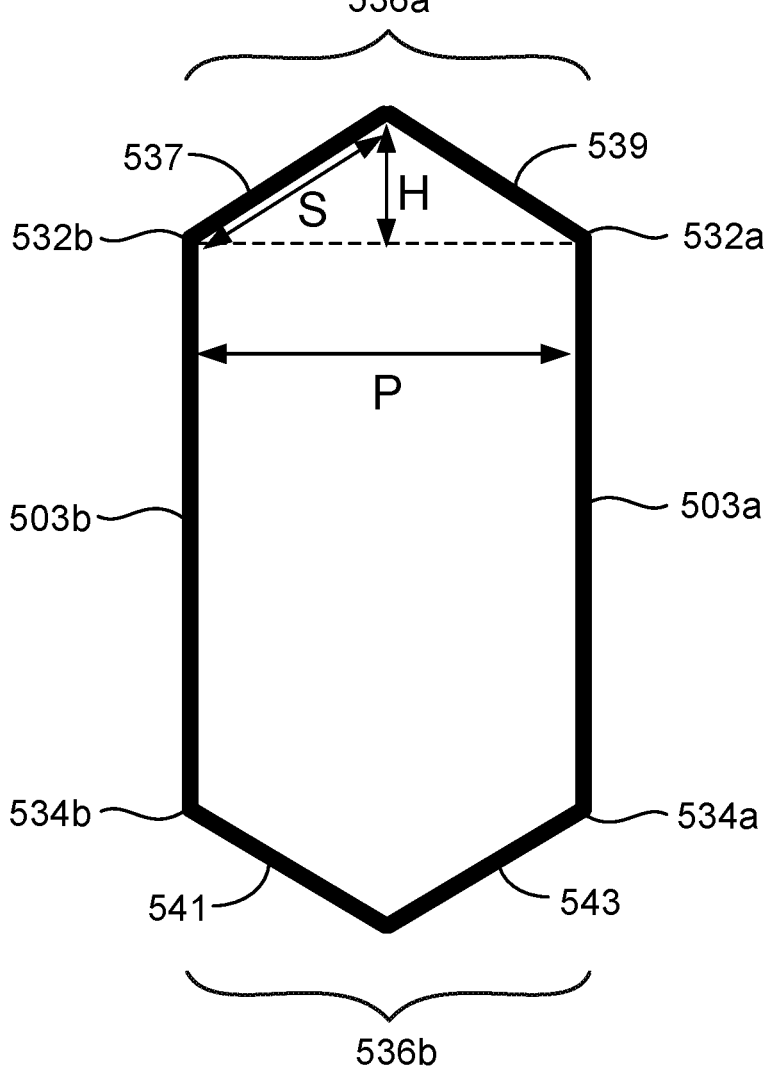
FIG. 5 is a plan view of a hexagonal fin pattern according to an embodiment of the present invention.

FIG. 5 is a plan view of a hexagonal fin pattern according to an embodiment of the present invention. Rather than adjacent fins being connected at one fin tip, adjacent fins in the hexagonal fin pattern are connected at both fin tips. As illustrated in FIG. 5, a first fin 503*a* can be connected to a second fin 503*b* via bridging structures 536*a* and 536*b*. Bridging structure 536*a* can connect a first fin tip 532*a* of the first fin 503*a* to a first fin tip 532*b* of the second fin 503*b*. In addition, bridging structure 536*b* can connect a second fin tip 534*a* of the first fin 503*a* to a second fin tip 534*b* of the second fin 503*b*. Each of the bridging structures 536*a-b* can have a first segment and a second segment. For instance, the bridging structure 536*a* is illustrated as including a first segment 539 disposed at the first fin tip 532*a* and a second segment 537 disposed between the first segment 539 and the second fin 503*b*. The first segment 539 and the second segment 537 are oriented towards each other so that the first segment 539 and the second segment 537 meet at a point between the first fin 503*a* and the second fin 503*b*. As shown in FIG. 5, the bridging structure 536*b* similarly has a first segment 541 and a second segment 543 oriented towards each other and meeting at a point between the first fin 503*a* and the second fin 503*b*.

In FIG. 5, the pitch P between the first fin 503*a* and the second fin 503*b* can be 2.2 µm. Assuming that the first segment 539 and the second segment 537 of the bridging structure 536*a* are equidistant, a height H of the bridging structure 536*a* can be 0.635 µm and the length S of each of the first segment 539 and the second segment 537 can be 0.787 µm. As a result, the angle between second fin 503*b* and second segment 537 will be 30°, resulting in a hexagonal fin pattern in which the internal angle between fins and segments and between first segments and second segments is 120°. The length of the fins can be on the order of 25 µm, resulting in an elongated hexagon in which the length (~25 µm) is an order of magnitude greater than the width (~2 µm). The length of the fins could also be smaller such that a regular hexagonal cell is formed for maximum packing density.

In implementations using the hexagonal structure illustrated in FIG. 5, a multi-level metal routing design can be utilized to make electrical contact with the gate region inside the hexagonal structure. A variety of multi-level interconnect structures (i.e., metal routing structures) including interlayer dielectrics and vias passing through the interlayer dielectrics can be utilized. Multi-level interconnect structures enable the characteristics of the gate routing lines to be separated from the characteristics of the gate contacts, for example, different thicknesses, different materials for gate routing lines and gate contacts, which make ohmic contact with the gate region of the FinFET, and the like. One of ordinary skill in the art would recognize many variations, modifications, and alternatives.

Figure 6:
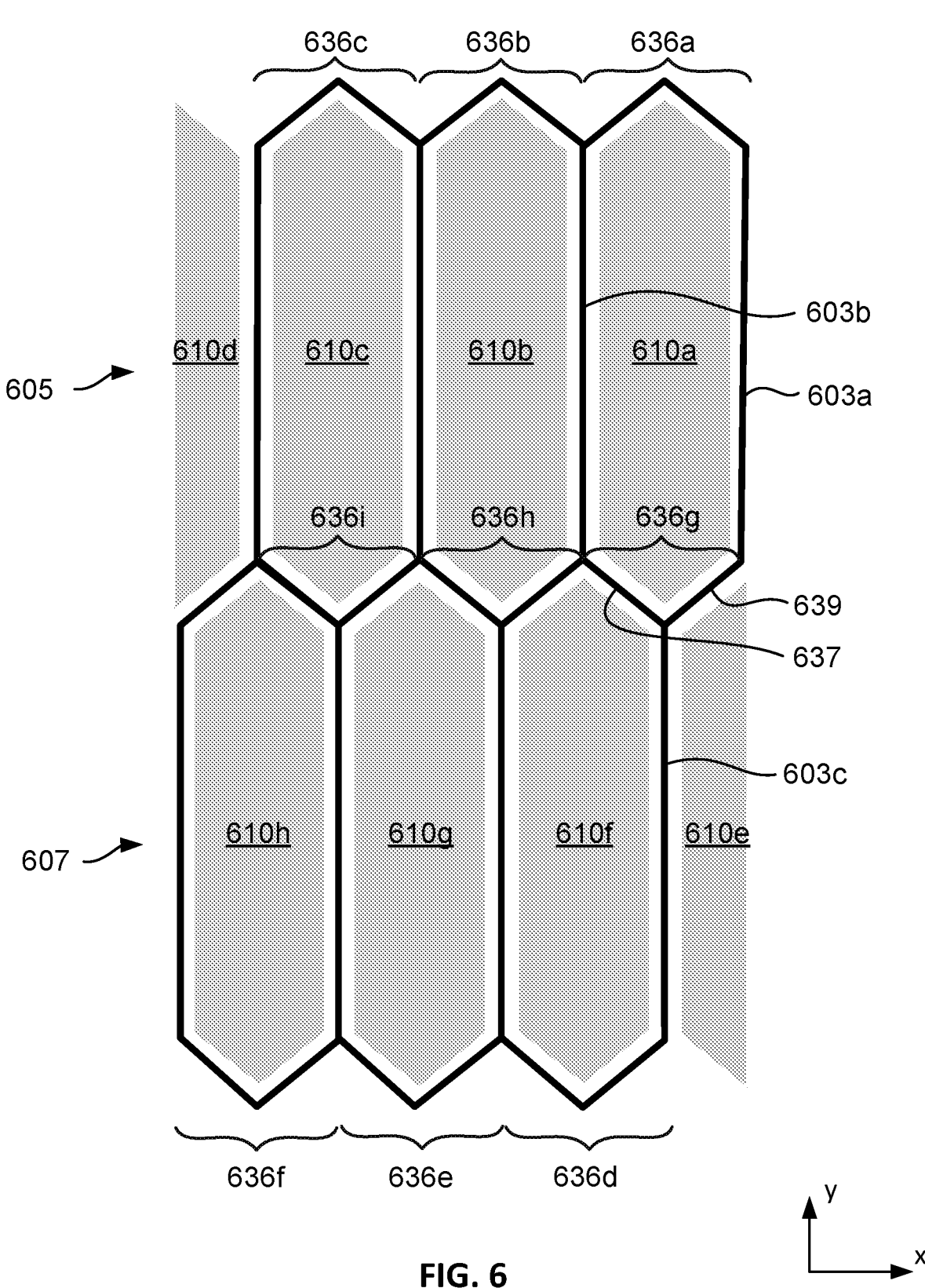
FIG. 6 is a plan view illustrating a hexagonal fin pattern layout according to an embodiment of the present invention.

FIG. 6 is a plan view illustrating a hexagonal fin pattern layout according to an embodiment of the present invention. The fin rows are illustrated as being offset in the x-direction, with adjacent fin rows being shifted by half of the fin pitch, so that fins in a first row 605 do not directly line up along the y-direction with fins in a second row 607. More specifically, the fins in one row align with a midpoint between fins (measured along the x-direction) in another row. Each fin 603 is connected to adjacent fins on either side of the fin 603 via a bridging structure 636. For the eight fins 603 shown in FIG. 6, there are nine bridging structures 636*a-i*. Fins in sequential rows can share segments of the bridging structures 636. For example, segment 639 of bridging structure 636*g* can be shared by fin 603*a* and fin 603*c*. In addition, segment 637 of bridging structure 636*g* can be shared by fin 603*b* and fin 603*c*. In the embodiment illustrated in FIG. 6, not only the fins, but the bridging structures can be active elements of the FinFET array, with source metal formed on the fins as well as the bridging structures.

Each hexagon of the hexagonal fin pattern surrounds a gate region 610. For instance, the hexagon that includes fin 603*a*, bridging structure 636*a*, fin 603*b*, and bridging structure 636*g* surrounds gate region 610*a*. In some examples, the gate regions 610*a-h* can make electrical contact to a gate bus. As discussed in relation to FIG. 5, a variety of multi-level interconnect structures including interlayer dielectrics and vias passing through the interlayer dielectrics can be utilized to provide gate bias from a gate bus to gate regions 610*a-h*. One of ordinary skill in the art would recognize many variations, modifications, and alternatives.

Figure 7:
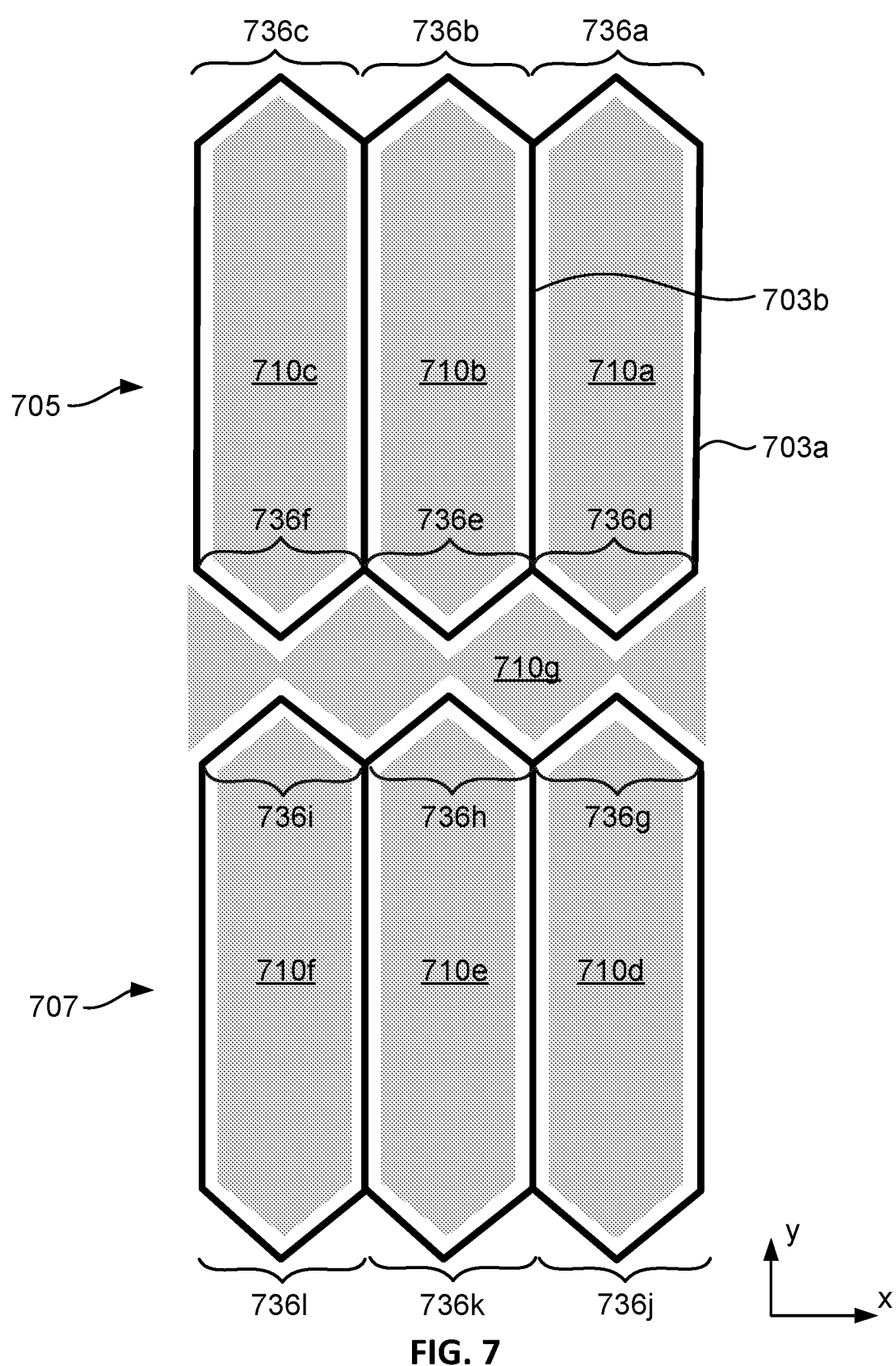
FIG. 7 is a plan view illustrating another hexagonal fin pattern layout according to an embodiment of the present invention.

FIG. 7 is a plan view illustrating another hexagonal fin pattern layout according to an embodiment of the present invention. The fin rows are illustrated as being inline, so that fins in a first row 705 directly line up along the y-direction with fins in a second row 707. Each fin 703 is connected to adjacent fins on either side of the fin 703 via a bridging structure 736. For the eight fins 703 shown in FIG. 7, there are twelve bridging structures 736*a-l*. Fins of sequential rows can be separated by a gate region 710*g*, such that segments of the bridging structures 636*a-l* are not shared between fins in adjacent rows.

Similar to FIG. 6, each hexagon of the hexagonal fin pattern can surround a gate region 710. For instance, the hexagon that includes fin 703*a*, bridging structure 736*a*, fin 703*b*, and bridging structure 636*d* surrounds gate region 710*a*. As discussed above, the gate regions 710*a-g* can be connected to a gate bus using a multi-level interconnect structure.

Figure 8:
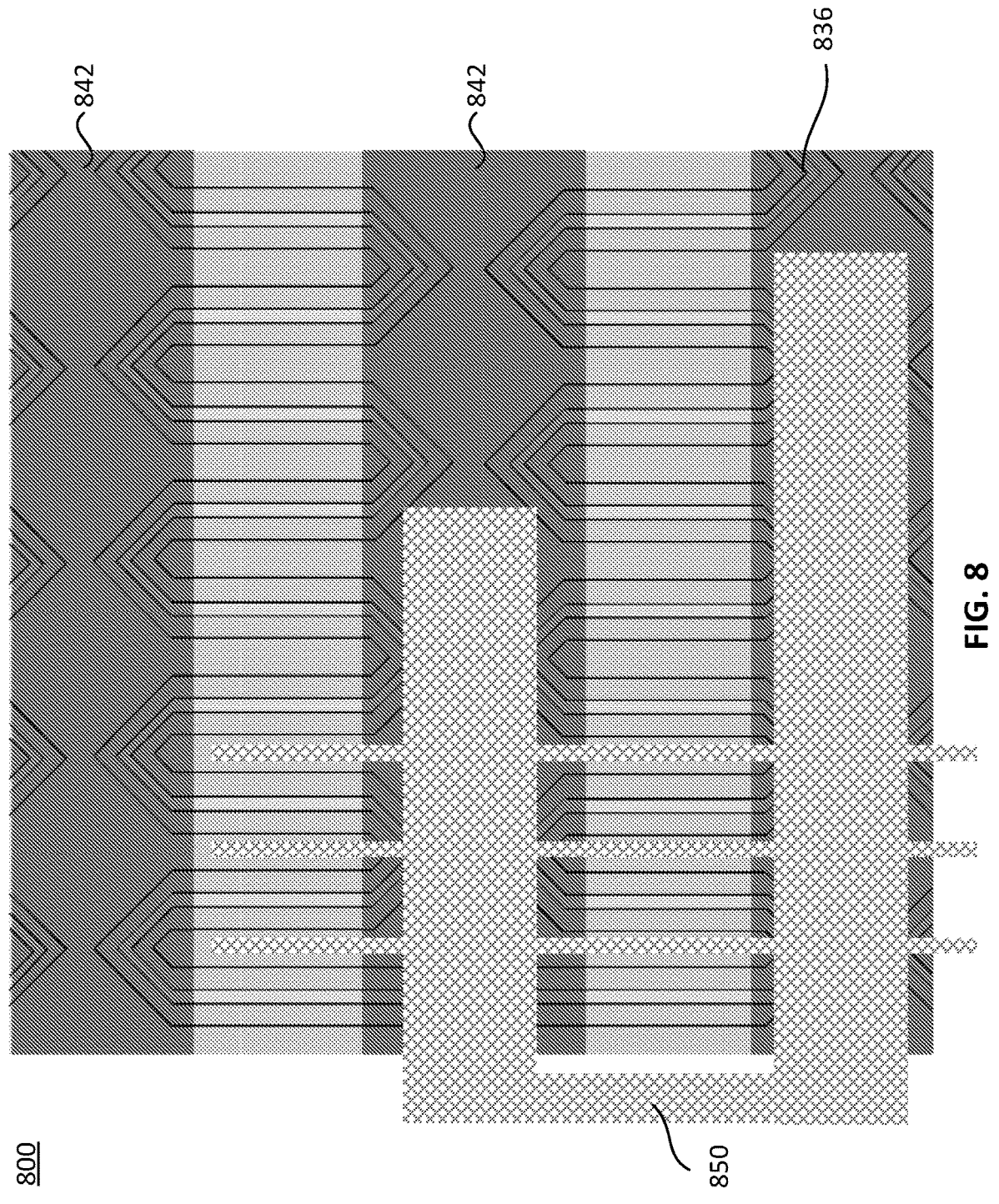
FIG. 8 is a plan view illustrating connected fins with neutralized bridging structures according to an embodiment of the present invention.

FIG. 8 is a plan view illustrating a fin array 800 with connected fins having neutralized regions 842 according to an embodiment of the present invention. A masking step using a mask that has openings in the mask in the regions of the bridging structures 836 and has mask material covering other portions of the FinFET array, can be utilized. As illustrated in FIG. 8, the openings in the mask will correspond to neutralized regions 842. With this mask in place on the substrate structure, implantation can be performed using a neutral species to neutralize the bridging structures 836 and the area laterally adjacent the bridging structures 836, making bridging structures 836 electrically inactive in some embodiments. Regions not covered by the implant mask receive the neutralization implant. The regions that are implanted are characterized by a reduced electrical conductivity, which can correspond, in some embodiments, to a reduced net doping density. Thus, the bridging structures 836 are characterized by a second electrical conductivity less than the electrical conductivity of the central regions of the fins. As described herein, the second electrical conductivity of the bridging structure can be achieved using an ion implantation process including the implantation of ions (e.g., a neutralization implant) into the bridging structure.

As discussed herein, neutralization does not require that the conductivity of the semiconductor material is equal to that of undoped material, rather, it includes reductions in conductivity compared to the conductivity of the material prior to a neutralization process. Thus, starting with a given doping level and initial conductivity in the second III-N layer making up the fins, the neutralization processes described herein can reduce the conductivity to a value lower than the value of the initial conductivity.

Neutralizing the fin tips as described herein reduces the electrical conductivity of the bridging structures 836 and the area laterally adjacent the bridging structures, i.e., the space between rows of fins, thereby reducing their electrical activity or making them electrically inactive, resulting in many advantages. First, the junction leakage is significantly reduced. Second, the complexity of the masking step, the implant step, and the photoresist strip step are low. Third, implant energies are well controlled and can be easily modified to achieve any desired neutralization depth. Fourth, this implant can be combined with an existing implant step of the right implant energy, making the whole process flow very efficient.

The ion implantation processes used herein implant ionic species to increase the resistivity (i.e., decrease the conductivity) of predetermined portions of the semiconductor layer to provide a spatial variation or modulation in the conductivity. Without limiting embodiments of the present invention, it is believed that the implantation process reduces the conductivity by at least one of the following mechanisms: compensating for dopants, annihilating dopants, increasing vacancy density, increasing void density, decreasing the total net charge in the epitaxial layer, or decreasing the density of ionized acceptors (donors for n-type material). Some or all of these mechanisms may provide for increased resistivity. Throughout the specification, reference is made to decreased conductivity or increased resistivity, which can also be referred to as a decrease in active charge, a decrease in active dopant species, or the like. Due to the robust nature of GaN-based materials, ion implantation can produce implanted ions interspersed with unchanged epitaxial material, effectively reducing the conductivity in an averaged sense, with voids or vacancies interspersed in the lattice with as-grown epitaxial material. The present invention is not limited by the physical mechanism resulting in the spatial conductivity modulation. Additionally, the mechanisms associated with ion implantation are also applicable to diffusion processes and hydrogen plasma treatments are appropriate.

In one embodiment, the neutralization process is an ion implantation process during which a neutralizing species is implanted into the areas exposed by the mask openings. The neutralizing species may be N, Ar, He, Si, or O, other suitable implant ions, or combinations thereof. In an embodiment, the dose of the neutralizing species is between $1\times10^{11}$ cm$^{-2}$ and $5\times10^{13}$ cm$^{-2}$. In an embodiment, the energy of the implantation is between 15 KeV and 700 KeV. In an embodiment, the energy of the implant for N is less than 500 KeV. In an embodiment, the energy of the implant for He is less than 200 KeV. In an embodiment, the energy of the implant for He is less than 170 KeV. In some embodiments, ion implantations with multiple energies are performed. In some embodiments, each of those ion implantations with multiple energies may have a different dose.

It should be understood that although ion implantation is used as an example neutralization process, this is not intended to be limiting. In another embodiment, the neutralization process is a hydrogen plasma treatment process, which deactivates the dopant atoms in the p-GaN layer.

In some embodiments, the neutralizing implant utilized to neutralize the bridging structures 836 and the gate materials surrounding the bridging structures 836 can be utilized during formation of the edge termination region. Additional description related to edge termination is provided in U.S. Patent Application Publication No. 2022/0013626, the disclosure of which is hereby incorporated by reference in its entirety for all purposes. In other embodiments, different implant processes, with different implant energies, different implant depths, different implanted ions, or the like can be utilized. One of ordinary skill in the art would recognize many variations, modifications, and alternatives.

Prior to ion implantation to neutralize the bridging structures 836 and the gate regions surrounding the bridging structures 836 to create neutralized regions 842, the electrical conductivity in the fins does not vary. The electrical conductivity in the gate region does not vary either. In other words, initially, the first fin tip, the second fin tip, and the central region of each fin have the same electrical conductivity. Embodiments of the present invention utilize a neutralizing ion implantation to form neutralized regions 842 to reduce the conductivity of the bridging structures 836 and the gate regions surrounding the bridging structures 836 in order to reduce the junction leakage.

Additionally, as illustrated in FIG. 8, gate metal 850 can be routed on the neutralized regions 842 to make electrical contact to gate regions between the fins at both ends of the fins. Only a portion of the gate metal 850 is illustrated for purposes of clarity. Additional description related to routing of electrical conductors on a neutralized region is provided in U.S. patent application Ser. No. 18/137,075, filed on Apr. 20, 2023, the disclosure of which is hereby incorporated by reference in its entirety for all purposes.

Figure 9:
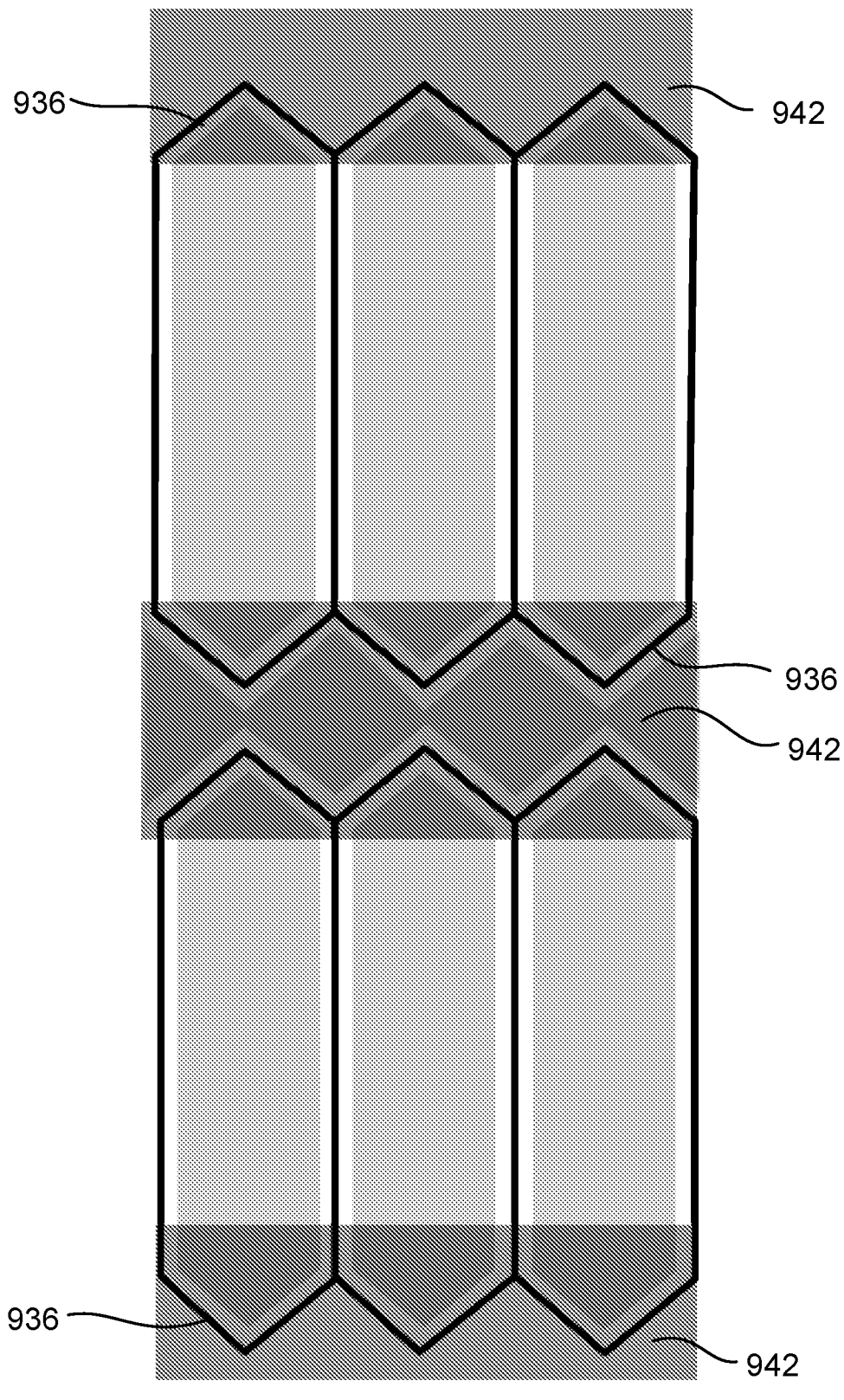
FIG. 9 is a plan view illustrating a hexagonal fin pattern layout with neutralized bridging structures according to an embodiment of the present invention.

FIG. 9 is a plan view illustrating a hexagonal fin pattern layout with neutralized regions 942 according to an embodiment of the present disclosure. Similar to FIG. 8, bridging structures 936 connecting fins at both fin tips can be neutralized to create neutralized regions 942. Additionally, a gate region between adjacent rows of fins can be neutralized as part of the neutralized regions 942. Prior to ion implantation to neutralize the bridging structures 936 and the gate regions surrounding the bridging structures 936 to create neutralized regions 942, the electrical conductivity in the fins does not vary. The electrical conductivity in the gate region does not vary either. In other words, initially, the first fin tip, the second fin tip, and the central region of each fin have the same electrical conductivity. Embodiments of the present invention utilize a neutralizing ion implantation to reduce the conductivity of the bridging structures 936 and the gate regions surrounding the bridging structures 936, including the space between adjacent rows of fins, in order to reduce the junction leakage.

As discussed in relation to FIG. 8, electrical conductors (e.g., gate metal) can be routed on the neutralized regions 942 to make electrical contact to gate regions between the fins at both ends of the fins. One of ordinary skill in the art would recognize many variations, modifications, and alternatives.

It should be understood that examples described above are not intended to be limiting. For example, in addition to bulk GaN substrates mentioned above, the substrate can be GaN on SiC or GaN on Si in other embodiments. As another example, instead of vertically regrown JFETs, the methods provided according to the present invention can also be applied to semiconductor devices such as lateral regrown transistors, implanted JFETs, diffused JFETs, and the like. As yet another example, instead of n-GaN as the fins and p-GaN as the regrown gate region, the JFET can be fabricated using p-GaN as the fins and n-GaN as the regrown gate region. Although some embodiments described herein are discussed in the context of GaN FinFETs, embodiments of the present invention are not limited to this particular semiconductor material and FinFETs fabricated in other materials can be utilized in conjunction with the methods and systems described herein, including materials that are not III-N semiconductor materials, such as silicon carbide, gallium oxide, or the like.

As an example, instead of nitrogen, other neutral species (e.g., argon, helium, or any combination of nitrogen, argon, and helium) can be used to perform ion implantation to neutralize the first fin tips, the first gate regions surrounding the first fin tips, the second fin tips, and the second gate regions surrounding the second fin tips. As another example, the implant depth can be controlled by changing implant energy. In one embodiment, the entire depth of the fins is fully implanted to neutralize the bottom of each fin. In another embodiment, shallow implantation is conducted, and the region close to the top surface of each fin is neutralized. In yet another embodiment, the implantation is intermediate between the full implant and shallow implantation.

While various embodiments of the invention have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus, the breadth and scope of the present disclosure should not be limited by any of the above-described exemplary embodiments.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known," and terms of similar meaning, should not be construed as limiting the item described to a given time period, or to an item available as of a given time. But instead these terms should be read to encompass conventional, traditional, normal, or standard technologies that may be available, known now, or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to," or other like phrases in some instances shall not be read to mean that the narrower case is intended or required in instances where such broadening phrases may be absent.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A vertical fin-based field effect transistor (FinFET) device comprising:

an array of FinFETs comprising a plurality of rows and columns of fins, each of the fins having a fin length and a fin width measured laterally with respect to the fin length and including:

a first fin tip disposed at a first end of each of the fins in a top view;

a second fin tip disposed at a second end of each of the fins in the top view, wherein the second end opposes the first end;

a central region disposed between the first fin tip and the second fin tip in the top view and characterized by an electrical conductivity;

a bridging structure connecting the first fin tip to an adjacent fin in the top view, wherein the first fin tip laterally separates the bridging structure from the central region in the top view, and wherein the bridging structure comprises a neutralized structure characterized by a second electrical conductivity less than the electrical conductivity of the central region, and wherein the bridging structure is configured to reduce current leakage; and a source contact electrically coupled to the central region;

a gate region surrounding each of the fins;

a gate routing line; and a plurality of gate leads coupled to the gate routing line; wherein:

at least one fin extends from a first row of the fins to a second row of the fins in the top view to reduce a number of fin tip ends in the array of FinFETs;

the gate routing line is disposed between the first row of the fins and the second row of the fins in the top view;

the plurality of gate leads each extend from the gate routing line between adjacent fins in the first row of the fins and adjacent fins in the second row of the fins towards each bridging structure in the top view; and the plurality of gate leads is configured to provide gate bias to the gate region surrounding each of the fins.

2. The vertical FinFET device of claim 1, wherein the bridging structure comprises:

a first segment extending from the first fin tip in the top view; and a second segment extending from the first segment to the adjacent fin, wherein the second segment is oriented towards the first segment in the top view.

3. The vertical FinFET device of claim 2, wherein the fin length, the first segment of the bridging structure, and the second segment of the bridging structure each align with an m-plane of a GaN crystal.

4. The vertical FinFET device of claim 1, wherein each of the fins comprises a III-N semiconductor.

5. The vertical FinFET device of claim 4, wherein the III-N semiconductor comprises GaN.

6. The vertical FinFET device of claim 1, wherein the bridging structure is a first neutralized bridging structure and the vertical FinFET device further comprises a second neutralized bridging structure connecting the second fin tip to the adjacent fin in the top view.

7. The vertical FinFET device of claim 6, wherein the second bridging structure comprises:

a third segment disposed at the second fin tip; and a fourth segment disposed between the third segment and a different adjacent fin, the fourth segment oriented towards the third segment.

8. The vertical FinFET device of claim 6, wherein the gate leads are interdigitated between adjacent fins.

9. The vertical FinFET device of claim 1, wherein the gate region comprises a regrown gate region.

10. The vertical FinFET device of claim 1, wherein at least one fin at an end of one of the plurality of rows comprises a first tip end devoid of any bridging structure.

11. The vertical FinFET device of claim 1, wherein the bridging structure includes implanted ions to provide the neutralized structure, and wherein the central region is devoid of the implanted ions that provide the neutralized structure.

12. A vertical fin-based field effect transistor (FinFET) device comprising:

an array of FinFETs comprising a plurality of rows and columns of fins, each of the fins having a fin length and a fin width measured laterally with respect to the fin length and including:

a first fin tip disposed at a first end of each of the fins in a top view;

a second fin tip disposed at a second end of each of the fins in the top view, wherein the second end opposes the first end;

a central region disposed between the first fin tip and the second fin tip in the top view and characterized by an electrical conductivity;

a bridging structure connecting the first fin tip to an adjacent fin in the top view, wherein the first fin tip laterally separates the bridging structure from the central region in the top view, and wherein the bridging structure comprises a neutralized structure characterized by a second electrical conductivity less than the electrical conductivity of the central region, and wherein the bridging structure is configured to reduce current leakage; and a source contact electrically coupled to the central region; and a gate region surrounding each of the fins.

13. The vertical FinFET device of claim 12, wherein the bridging structure includes implanted ions that provide the neutralized structure, and wherein the central region is devoid of the implanted ions that provide the neutralized structure.

14. The vertical FinFET device of claim 12, wherein the bridging structure comprises:

a first segment disposed at the first fin tip; and a second segment disposed between the first segment and the adjacent fin, the second segment oriented towards the first segment.

15. The vertical FinFET device of claim 14, wherein the fin length, the first segment of the bridging structure, and the second segment of the bridging structure each align with an m-plane of GaN.

16. The vertical FinFET device of claim 12, wherein each of the fins comprises a III-N semiconductor.

17. The vertical FinFET device of claim 12, wherein the bridging structure is a first bridging structure and the vertical FinFET device further comprises a second bridging structure connecting the second fin tip to the adjacent fin in the top view.

18. The vertical FinFET device of claim 17, wherein the second bridging structure comprises:

a third segment disposed at the second fin tip in the top view; and a fourth segment disposed between the third segment and the adjacent fin, the fourth segment oriented towards the third segment in the top view.

19. The vertical FinFET device of claim 17, wherein the first bridging structure and the second bridging structure are shared by adjacent rows of the plurality of rows in the top view.

20. The vertical FinFET device of claim 12, wherein adjacent rows of the plurality of rows are separated by a second gate region.

* * * * *